(12) United States Patent
Kouznetsov et al.

(10) Patent No.: US 8,460,763 B2
(45) Date of Patent: Jun. 11, 2013

(54) METHOD FOR ENHANCING DYNAMIC STIFFNESS

(75) Inventors: Vladimir Kouznetsov, Nynäshamn (SE); Klim Kouznetsov, legal representative, Nynäshamn (SA); Mihai Nicolescu, Lidingö (SE); Olga Meza, Stockholm (SE); Lars Hemmingsson, Stockholm (SE)

(73) Assignee: Plasmatrix Materials AB, Stockholm (SE)

( * ) Notice: Subject to any disclaimer, the term of this patent is extended or adjusted under 35 U.S.C. 154(b) by 651 days.

(21) Appl. No.: 12/529,475

(22) PCT Filed: Feb. 29, 2008

(86) PCT No.: PCT/SE2008/050225
§ 371 (c)(1),
(2), (4) Date: Mar. 25, 2010

(87) PCT Pub. No.: WO2008/105736
PCT Pub. Date: Sep. 4, 2008

(65) Prior Publication Data
US 2011/0008576 A1    Jan. 13, 2011

(30) Foreign Application Priority Data
Mar. 1, 2007 (SE) ..................................... 0700552

(51) Int. Cl.
*H05H 1/24* (2006.01)
(52) U.S. Cl.
USPC ......................................... 427/569; 427/577
(58) Field of Classification Search
USPC ................................................ 427/569, 577
See application file for complete search history.

(56) References Cited

U.S. PATENT DOCUMENTS

| | | | |
|---|---|---|---|
| 3,692,370 A | 9/1972 | Hasz | |
| 5,176,868 A | 1/1993 | Davis | |
| 5,239,886 A | 8/1993 | Kohring | |
| 5,751,113 A * | 5/1998 | Yashnov et al. | 315/111.21 |
| 5,892,329 A * | 4/1999 | Arkhipov et al. | 315/111.91 |
| 5,965,249 A | 10/1999 | Sutton et al. | |
| 6,059,533 A | 5/2000 | Stoker et al. | |
| 6,102,664 A | 8/2000 | Nguyen | |
| 6,901,914 B1 | 6/2005 | Becene et al. | |
| 2002/0140103 A1* | 10/2002 | Kloster et al. | 257/767 |
| 2003/0198157 A1 | 10/2003 | Smith | |
| 2004/0266065 A1 | 12/2004 | Zhang et al. | |
| 2005/0035731 A1* | 2/2005 | Secheresse et al. | 315/500 |
| 2006/0057054 A1 | 3/2006 | Fujioka et al. | |
| 2006/0060696 A1 | 3/2006 | Cordy, Jr. | |
| 2006/0089007 A1* | 4/2006 | Huang | 438/763 |

FOREIGN PATENT DOCUMENTS

| | | |
|---|---|---|
| CA | 1073954 | 3/2008 |
| DE | 10342401 A1 * | 4/2005 |
| EP | 0 860 232 A2 | 8/1998 |
| EP | 1 008 408 A2 | 6/2000 |
| JP | 57151046 | 9/1982 |
| JP | 2004074906 | 3/2004 |
| JP | 2004291408 A | 10/2004 |
| JP | 2007-188841 * | 7/2007 |
| RU | 2 224 039 C2 | 2/2004 |
| WO | 89/11207 | 11/1989 |
| WO | 96/06518 | 2/1996 |
| WO | 99/65821 A1 | 12/1999 |
| WO | 2004/035883 A2 | 4/2004 |
| WO | 2008/105736 A3 | 9/2008 |

OTHER PUBLICATIONS

Jung, Y., et al., "Controlling the aligned growth of carbon nanotubes by substrate selection and patterning". Mat. Res. Soc. Symp. Proc. vol. 706, 2002 Materials Research Society, pp. 1-6.*
International Search Report issued in corresponding International Publication No. WO 2008/105736 on Sep. 5, 2008.
Wei, B. Q., et al., "Growing pillars of densely packed carbon nanotubes on Ni-coated silica," Carbon 40 (2002), pp. 47-51.
Zhurin, V. Z., et al., "Physics of closed drift thrusters," Plasma Sources Sci. Tecnol. 8 (1999), pp. R1-R20.
Depriest, J., "Aircraft Engine Attachment and Vibration Control," Lord Corporation, Lord Library of Technical Articles, LL-6505, pp. 1-20.
Goyal, A., et al., "Enhanced yield strength in iron nanocomposite with in situ growth single-wall carbon nanotubes," J. Mater. Res., vol. 21, No. 2, (2006), pp. 522-528.
Saurakhiya, N., et al., "Pulsed laser deposition-assisted patterning of aligned carbon nanotubes modified by focused laser beam for efficient field emission," Carbon 43 (2005), pp. 2128-2133.
Garcia, E. J., et al., "Fabrication of composite microstructures by capillarity-driven wetting of aligned carbon nanotubes with polymers," Nanotechnology 18 (2007) 165602, pp. 1-11.
Huang, C. J., et al., "Field Emission from a Carbon Nanofiber/ Carbon Nanocone Composite Structure Fabricated by a Two-Step Growth Process," Journal of the Electrochemical Society, 153 (1), pp. H15-H17 (2006).
Boskovic, B. O., et al., "Low temperature synthesis of carbon nanofibres on carbon fibre matrices," Carbon 43 (2005), pp. 2643-2648.
Schultrich, B., et al., "Nanostructered Carbon Films," Advanced Engineering Materials 2000, 2, No. 7, pp. 419-422.
Dong-Hau, K., et al., "Organized carbon-nanotubes grown by chemical vapor deposition with a gas-phase catalyst of iron pentacarbonyl," Proceedings of 2005 5th IEEE Conference on Nanotechnology, Nagoya, Japan, Jul. 2005.

(Continued)

*Primary Examiner* — Bret Chen
(74) *Attorney, Agent, or Firm* — Potomac Patent Group, PLLC

(57) ABSTRACT

A method for composite material synthesis at the surface of a work piece, wherein it includes PECVD, PEPVD methods and plasma generation by electric discharges with closed electron drift. The composite material comprises at least one layer of substantially parallel carbon pillars extending from the bottom surface of the at least one layer up to the top surface of the at least one layer. The carbon pillars have a cross-sectional dimension in the range of 50-200 μm, and heights in the range of 50 μm-2 mm.

25 Claims, 11 Drawing Sheets

OTHER PUBLICATIONS

Li, Z. S., et al., "Evaluation of the internal friction and elastic modulus of the superhard films," Materials Science and Engineering A, vol. 370, Issues 1-2, Apr. 15, 2004, pp. 186-190.

Roth, J. R., "Industrial Plasma Engineering," 1995, vol. 1, Book.

Zhou, X., et al., "Interfacial damping characteristics of carbon nanotube-based composites" Composites Science and Technology, vol. 64, Issue 15, Nov. 2004, pp. 2425-2437.

Frogley, M. D., et al., "Mechanical properties of carbon nanoparticle-reinforced elastomers," Composites Science and Technology, vol. 63, Issue 11, Aug. 2003, pp. 1647-1654.

Tang, D. L., et al., "Linear Ion Source with Magnetron Hollow Cathode Discharge," Review of Scientific Instruments, vol. 76, 113502, (2005).

* cited by examiner

60 % $N_2$, 30 % $C_2H_2$, 10 % $O_2$

40 % $N_2$, 50 % $C_2H_2$, 10 % $O_2$

10 % $N_2$, 80 % $C_2H_2$, 10 % $O_2$

40 % $N_2$, 50 % $C_2H_2$, 10 % $O_2$

40 % N₂, 50 % C₂H₂, 10 % O₂

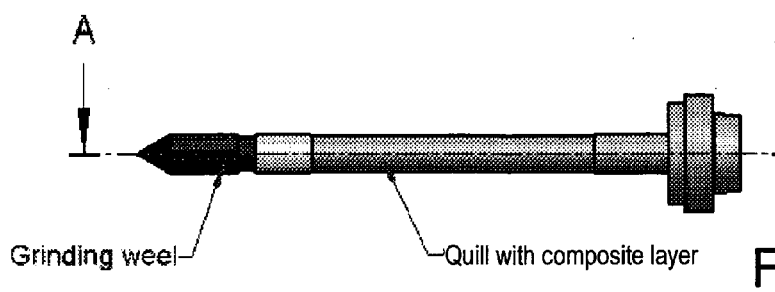
Fig. 9a
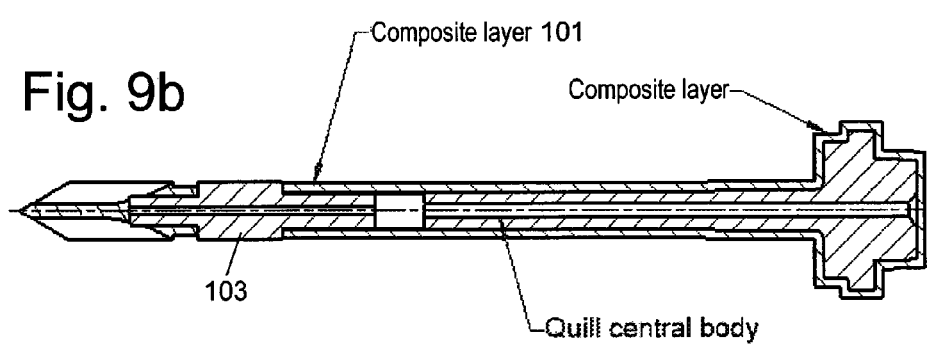
Fig. 9b
Fig. 9c
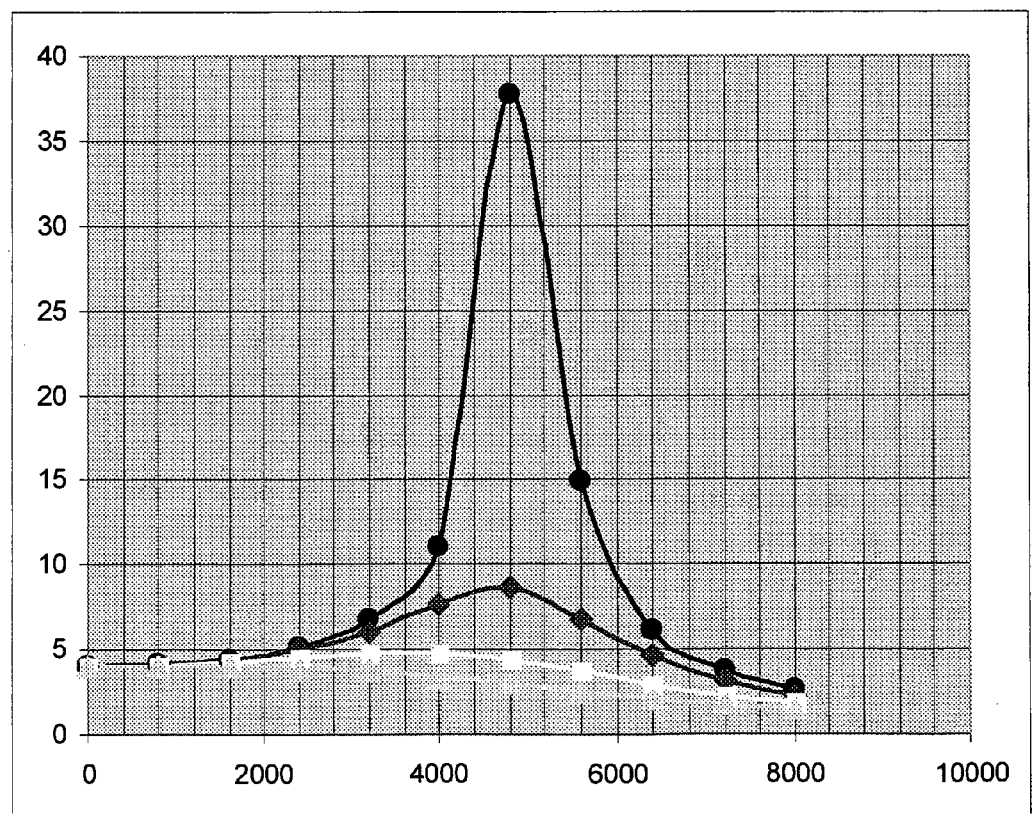

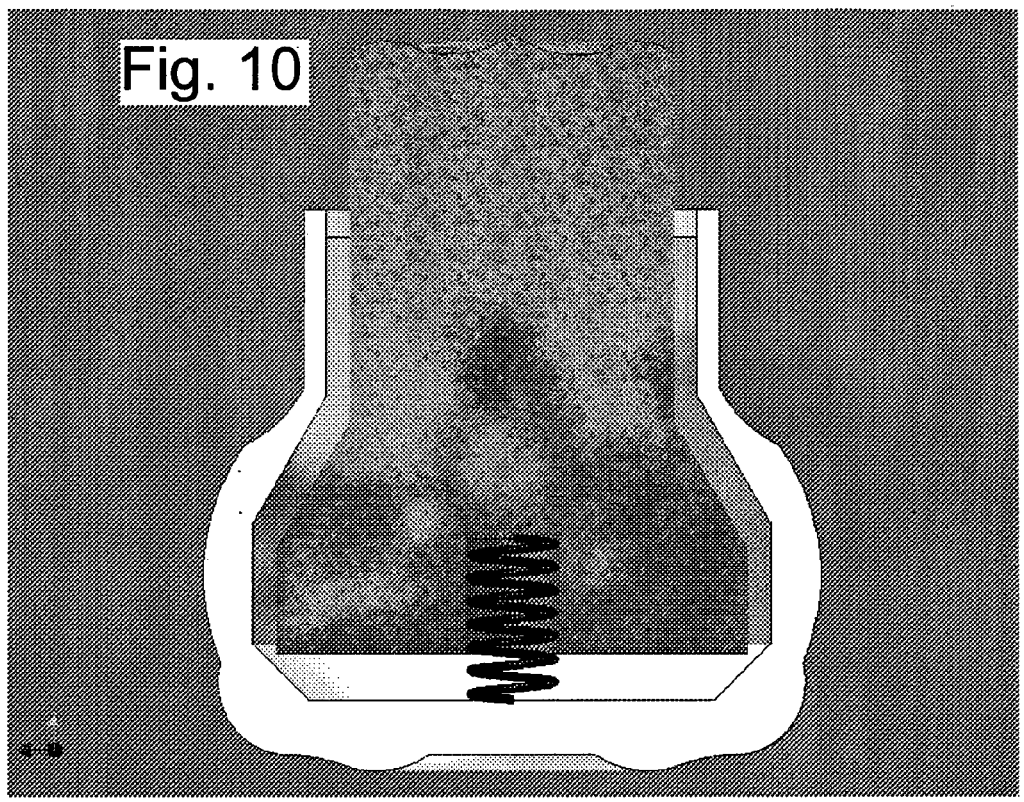
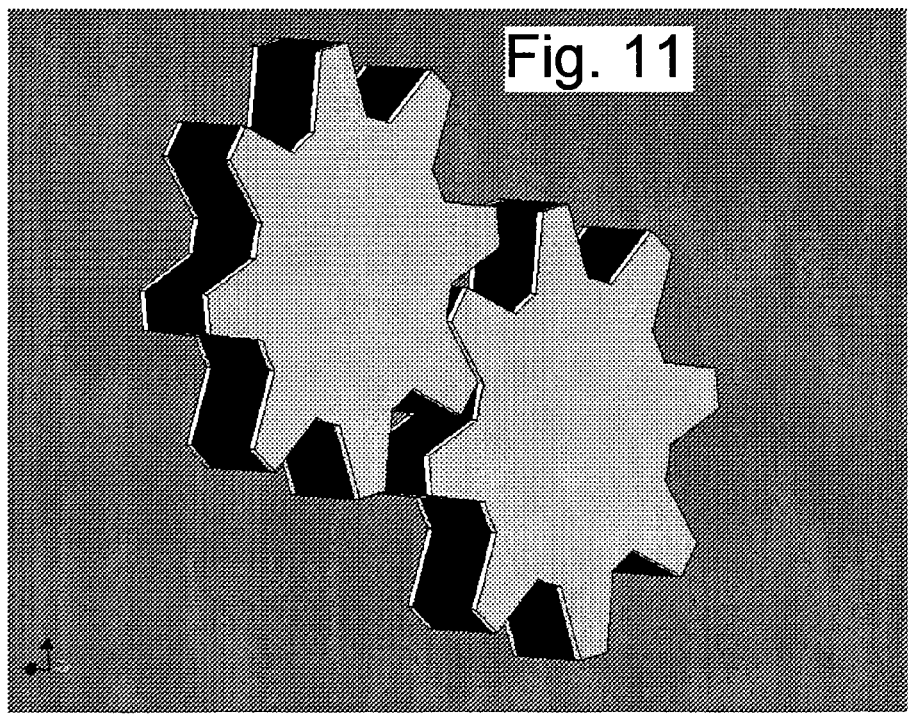

Fig. 12a
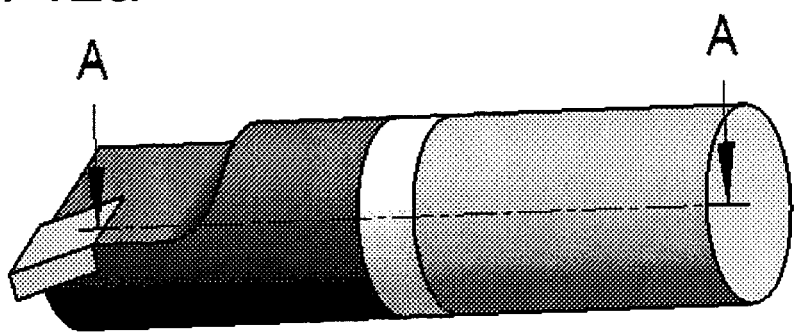
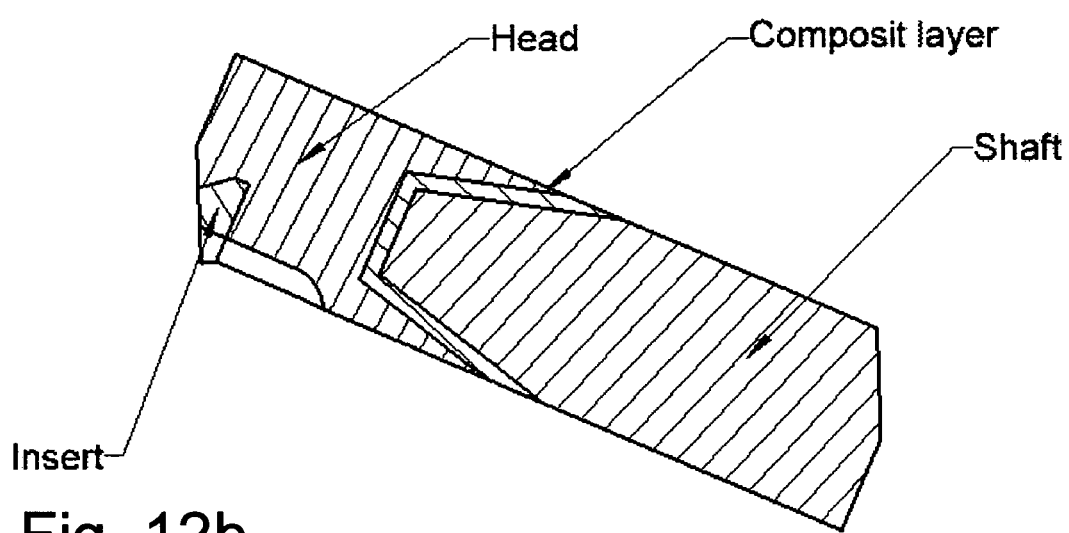
Fig. 12b

METHOD FOR ENHANCING DYNAMIC STIFFNESS

RELATED APPLICATIONS

This application claims priority and benefit from Swedish patent application No. 0700552-3, filed Mar. 1, 2007, the entire teachings of which are incorporated herein by reference.

TECHNICAL FIELD

The present invention relates to machines in general and in particular to machines and tools for material removal.

BACKGROUND

Modern machining technology development focuses largely on enhancing the reliability, efficiency, and precision in material removal processes. It is now clearly recognized that the dynamic stiffness properties of the machine tools and the tools themselves play an extremely important role in the general performance of such processes.

Dynamic stiffness as a structural property is also of paramount importance in various kinds of vehicles and the components thereof. An example includes aircraft engines and their attachment to the wings, where a correct adjustment of the dynamic stiffness results in reduction of noise in the cabin area, see Jesse De Pries, "Aircraft Engine Attachment and Vibration Control", Lord Corporation, Lord Library of Technical Articles, LL-6505, U.S. Pat. No. 6,102,664 and U.S. published patent application 2006/0060696.

Dynamic stiffness plays in fact a role in a much wider range of applications, for example in sports hardware, see U.S. Pat. No. 5,176,868, computer hardware, see U.S. published patent application 2003/0198157, and in space exploration, see the Japanese published patent applications 2004074906 and JP 57151046.

When machining work pieces through material removal, high dynamic stiffness helps to obtain high dimensional precision and fine surface finish. High dynamic stiffness also promotes longer machine and tool lifetime, increased reliability, and improves the environment. Numerous recently published patents protect the ongoing development in this area, see in particular U.S. Pat. No. 3,692,370, European published patent application 1008408, Canadian patent 1073954 and European published patent application 0860232.

The currently used methods for enhancing dynamic stiffness of the machines are based on the three different approaches or a combination of thereof. These are structural improvement of the machine design, which is often both difficult and costly, use of materials having a high damping capacity in the machine parts themselves, see U.S. Pat. Nos. 6,901,914 and 5,239,886, and separation of the machine parts by layers of a damping material, see U.S. Pat. No. 6,102,664.

Hence, there is a high demand for new efficient materials that increase the dynamic stiffness of machines, and subsequently there is continuous development of new materials, see U.S. Pat. No. 6,059,533 and Japanese published patent application 2004291408. An analysis of recent patents and related publications shows that these are materials mainly are based on resin or viscoelastic polymers such as in the cited Japanese patent application 2004291408. Another kind of composite materials includes materials comprising fillers, see U.S. Pat. No. 5,965,249. Among these materials the perhaps most promising class is carbon nanoparticle reinforced composites. By adding carbon nanoparticles it is possible to significantly increase the dynamic stiffness of polymers, metals, and concrete, see X. Zhou et al., "Interfacial damping characteristic of carbon nanotube-based composites", Composites Science and Technology, Vol. 64, 2004, pp. 2425-2437, and Mark D. Frogley et al., "Mechanical properties of carbon nanoparticle-reinforced elastomers", Composites Science and Technology, Vol. 63, 2003, pp. 1647-1654. It has been shown that the stiffness of polymers can be enhanced 2-3 times by imbedding carbon nanoparticles in polymers. It is also been shown that the damping capacity of polymers can be significantly enhanced by the same method.

Another example is Cu based alloys, see the Russian patent 2224039, that when enhanced by carbon nanoparticles render a stiffness that is about 1.4-1.5 times higher than that of ordinary copper and increases the static stiffness to levels comparable with that of beryllium brass. It is a well known fact that beryllium brass is the strongest copper based alloy and is used for manufacturing of springs having a high spring stiffness. A high static stiffness together with high damping capacity is required for achieving of a high dynamic stiffness.

However, these known materials and the processes for manufacturing them have a number of serious drawbacks.

The drawbacks of polymer based composites, on one hand, are poor tribological properties, limited operating temperatures, less than 100° C., and they exhibit the natural tendency of polymers to degrade in time. In addition, the damping capacity of these materials is strongly dependent on operational temperature and frequency. On the other hand, the production of carbon nanoparticles reinforced metal composites is faced with the problem of carbon oxidation, i.e. "combustion", during the process of mixing the particles into the melted metal. Therefore, it can be said that there at present are no industrially scalable processes for manufacturing high dynamic stiffness materials.

Nanocomposite materials having an non-polymer matrix material and enhanced mechanical characteristics are disclosed in A. Goyal et al., "Enhanced yield strength in iron nanocomposite with in situ grown single-wall carbon nanotubes", J. Mater. Res., Vol. 21, No. 2, Feb. 2006, pp. 523-528. Single wall nanotubes were grown in a porous iron material using acetate precursors.

A composite material comprising carbon nanotubes disposed in a metal matrix is disclosed in published U.S. patent application 2004/0266065 for Zhang et al. The material is formed by first growing nanotubes on a substrate using CVD processes and catalysts. In the CVD precursors such as methane, ethylene and acetylene can be used. The substrate has to be heated to relatively high temperatures such as at least 700° in the processes. A layer of metal is then deposited over the carbon nanotubes using methods such as electroplating, electroless plating, sputtering and CVD.

SUMMARY

It is an object of the present invention to provide high dynamic stiffness materials and an industrially scalable process to manufacture such materials.

The material can be said to have the general chemical formula $M(CN_xH_yO_k)_z$ and includes pillars embedded in a matrix material, such as a metal, a metal alloy or silicon. The pillars may consist of carbon nanoparticles. The coefficients x, y, k, z indicates atomic percentage. The carbon nanoparticles are taken to be clusters of atoms, where $sp^2$ and $sp^3$ atomic bonds between carbon atoms may appear in different proportions, as can be inferred from morphological studies of the structure of the material. It is known that graphite consists purely of sp-2 hybridized bonds, whereas diamond consists purely of sp-3 hybridized bonds. Materials that are high in sp-3 hybridized bonds are referred to as tetrahedral amorphous carbon, owing to the tetrahedral shape formed by sp-3 hybridized bonds, or as diamond-like carbon, owing to the similarity of many physical properties to those of diamond. Amorphous carbon materials may also be stabilized by terminating dangling pi bonds with hydrogen. These materials are then called hydrogenated amorphous carbon. If nitrogen is present in the material it is called hydrogenated carbon nitride. sp-2 and sp-3 bonds are characteristic of materials such as fullerenes, nanotubes, astralenes, fulleroids and nanofibrils. In Table 1 the concentrations of elements in the material are listed.

TABLE 1

| Chemical Element | at % |
|---|---|
| Pillars | Pillars |
| Carbon (C) | 4-90 |
| Oxygen (O) | 1-20 |
| Nitrogen (N) | 0-30 |
| Hydrogen (H) | 3-40 |
| Matrix | Matrix |
| Metal | 1-99 |
| Alloy | |
| Silicon | |

Characteristic dimensions of the particles may be in the range of 20-100 nm. The particles are embedded in a matrix "M" in a concentration ranging as much as Z=1-99 at % of the matrix. If the composite material has a low percentage of the matrix material, i.e. a low Z-value, the mechanical properties of it are about the properties of aluminum. For a high Z-value "z" the mechanical properties are comparable to those of the matrix material.

If the composite material has a high percentage of the matrix material, i.e. has a high Z-value, its tribological and other mechanical' properties assume or are comparable, as can be expected, to the properties of the matrix material. The damping efficiency has the opposite tendency. Materials having a low Z-value have damping properties that are similar to those of viscoelastic polymers which are the highest among known materials. As an example a carbon nanoparticle reinforced copper matrix was investigated for which Z was chosen to be 50%, this being considered a low Z-value considering the fact that Z is given as an atom percentage and the actual masses of the substances involved. Young's modulus was measured to have a value of 150 GPa and a damping decrement 62 $s^{-1}$ for a steel bar having a diameter of 32 mm, a length of 210 mm and a coating consisting of a damping layer having a thickness of 0.5 mm. Hence, the addition of carbon particles into a copper matrix significantly enhances such a parameter as static stiffness. This can be compared to the static stiffness of the copper which is about 100 GPa and that of beryllium brass which is about 150 GPa, beryllium brass being as said above the strongest copper based alloy. It means that adding carbon particles to a copper matrix significantly increases the static stiffness of the matrix material.

A method for producing the material combines PVD and CVD methods.

A low pressure CVD method that can be used is based on the decomposition ("cracking") of carbon containing gases by collisions of the gas molecules with electrons. The electrons are generated by a direct current discharge between electrodes, the work piece being the cathode of the discharge. The anode is the inner wall of the process chamber in which the discharge is generated. The work piece and the anode are covered with a material that before start of the discharges has dielectric properties. It was found that the material obtains a sufficient electrical conductivity if a high voltage of e.g. about 2 kV is applied between the electrodes. The discharge is ignited by a plasma source having closed electron drift. This method generates at the work piece surface carbon nanoparticles having characteristic dimensions of about a few nanometers. The nanoparticles are assembled to form aggregates having characteristic dimensions of up to one hundred or some hundreds of nanometers. The dimensions of the aggregates can be adjusted according the application requirements. The aggregates are embedded in an amorphous matrix. The matrix can be of the same material or any metal or alloy or silicon. The density of the aggregates in the matrix can be regulated by the gas mixture composition. The material can be precipitated in layers. The thickness of the layers is variable from 10 nm to 2000 µm. The method allows precipitation of the composite material onto work pieces with rate from 10 to 200 µm/h. A layer having a thickness of 1500-2000 µm was deposited on metal work pieces without cracking and delaminating. It is a unique result because there is no other material and technology allowing deposition of such thick layers. The characteristic thickness of layers deposited by PVD and CVD methods is generally in the range of only a few micrometers.

A PVD method is used to form the metal, the alloy or the silicone matrix. The PVD method used can be any type. The main requirement is a sufficient precipitation rate that has to be in the range of 10-200 µm/h. Suitable specific methods may include plasma spraying, electric arc and sputtering.

Before undertaking the DETAILED DESCRIPTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

FIGS. 9a and 9b are schematics of an internal grinding tool having enhanced dynamic stiffness, FIG. 9c is a graph of the computed amplitude of tool vibration for different rates of vibration damping, FIG. 10 is schematic of a turbine blade having an enhanced dynamic stiffness, FIG. 11 is a perspective schematic view of gear assembly having enhanced dynamic stiffness and/or vibration damping, and FIGS. 12a and 12b are schematics of a cutting tool having enhanced vibration damping.

DETAILED DESCRIPTION

Dynamic stiffness is an important characteristic of any machine, machine tool and the very tools themselves. Methods of enhancing the dynamic stiffness of machines include such methods as improving the overall machine design, using suitably designed structural members in the machines and using in components of the machines special materials that have a high own dynamic stiffness. see e.g. the Internet document at http://www.engissol.com/Article2.htm, FIG. 3. Dynamic stiffness may strictly be defined as the ratio of an applied oscillatory or excitation force and the resulting mechanical vibration, the applied force and response e.g. given as their amplitudes or means. Hence, the dynamic stiffness of a mechanical structure can be said to be the amplification of the static stiffness in the frequency range of the excitation force. Therefore, dynamic stiffness is determined by the static stiffness (at a frequency equal to zero) of the body and the damping characteristics of the body. It means that in order to increase the dynamic stiffness of a component it is necessary to have an appropriate structural and geometric design thereof and to use statically stiff materials in combination with materials having a high damping capacity. The most common material used having a high damping capacity is viscoelastic polymers. However, it has a relatively low static stiffness and the natural tendency of polymers to degrade. For damping purposes, viscoelastic polymers are used as relatively thin layers arranged between suitable machine parts. The thickness of such layers is about 100-1000 µm. The damping layers are often used in combination with constraining layers to increase the to tribological properties and in particular the static stiffness the machine part, see the above cited article by Ball and Salyer.

Another common method of manufacturing damping materials is by embedding carbon nanoparticles in an initially liquid matrix. The most common matrix materials used include various polymers and cement. Bodies of such materials can be manufactured by casting. However, this method does not allow the manufacture of a composite material based on a metal matrix due to oxidation of the carbon particles when mixing the particles into a liquid metal.

Figure 9D:
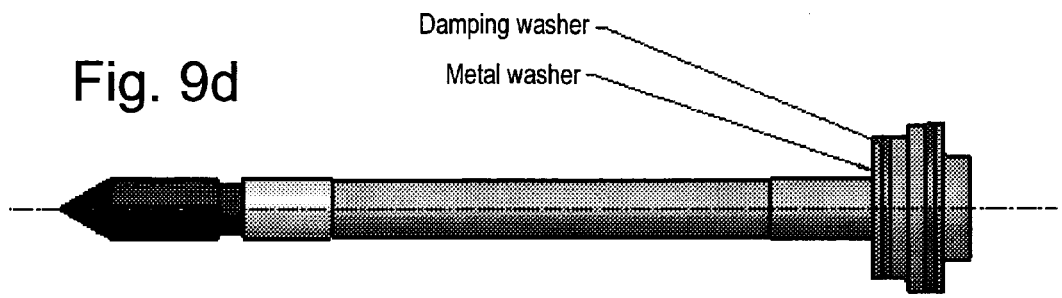
FIGS. 9d and 9e are similar to FIGS. 9a and 9b and illustrate an alternative embodiment of a grinding tool.
Figure 9E:
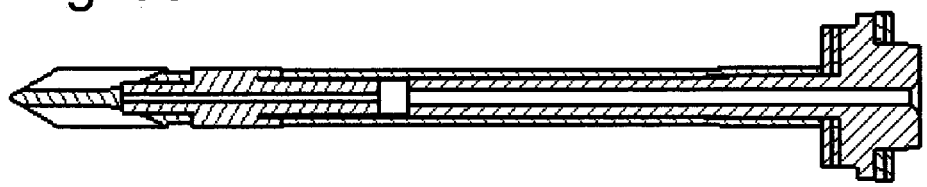
Figure 9F:
FIGS. 9f and 9g are similar to FIGS. 9a and 9b and illustrate still another alternative embodiment of a grinding tool.
Figure 9G:
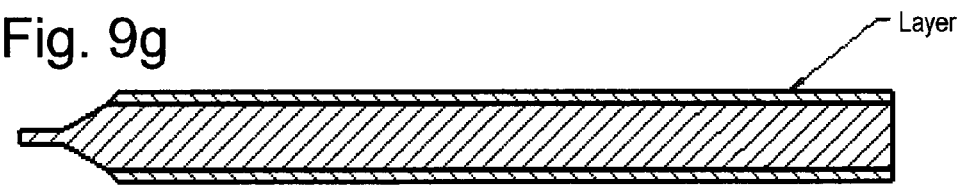

A method and apparatus for producing layers of materials having a high dynamic stiffness and other advantageous characteristics will now be described. A layer of such a material can e.g. be used as an external stiffening and damping layer 101 applied to the slender body or quill 103 of an internal grinding tool, see.e.g. FIGS. 9a and 9b, to give the tool improved mechanical properties.

The material of the layers can in one embodiment be said to be a metal material, an alloy material or silicon reinforced with carbon particles. However, the composite material can generally be said to comprise a multitude of carbon particles arranged in clusters embedded in a matrix. The matrix can include the same composite material as the carbon particles themselves, or it can be a metal, a metal alloy or silicon. The material can be manufactured in layers having a total thickness of up to a few mm. In a method of synthesizing the material a PECVD or PEPVD method is combined with generating a plasma in a plasma generator of the type having closed electron drift. A layer of the material can be synthesized at the surface of a work piece by generating direct current electric discharges in a gas mixture containing a carbon precursor such as acetylene and also oxygen and nitrogen.

Figure 8:
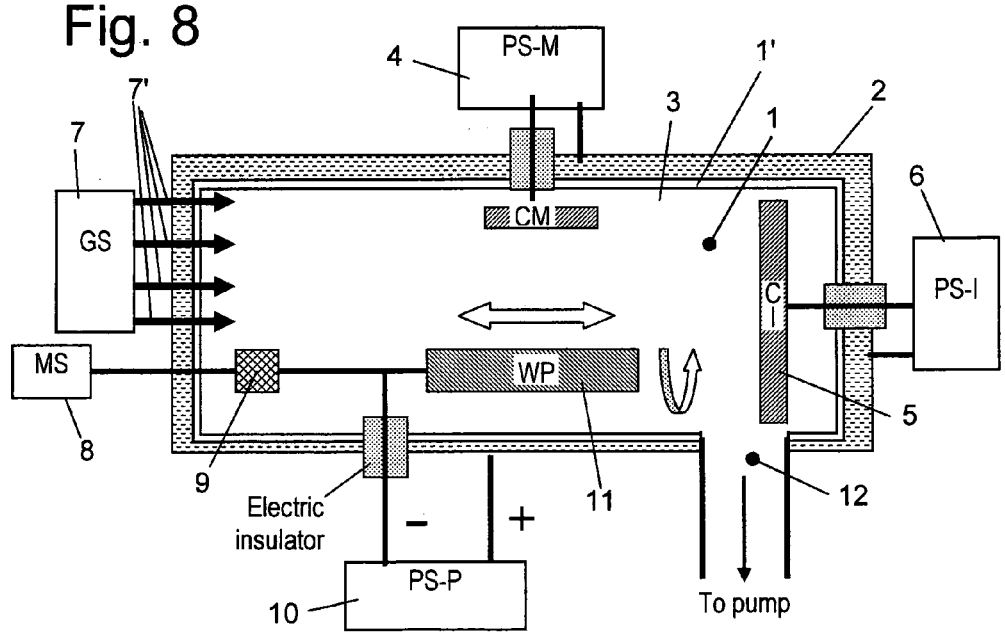
FIG. 8 is a schematic of apparatus for producing a composite carbon particle reinforced material.

FIG. 8 is a schematic of apparatus that may be used for synthesis of the composite material as described herein at the surface of a work piece that also can be called a substrate. A process chamber 1 has inner walls 1' that when in operation are covered by a resistive layer of the composite material. Therefore, almost all power of the electric discharges in which the walls of the process chamber are used as the anode is dissipated at the chamber. Hence, the process chamber 1 is strongly heated and therefore the process chamber is surrounded by a cooling water shell 2. The cooling water shell is electrically shot connected to the inner wall. A first cathode (CM) 3 constituting one part of a matrix plasma source is arranged at and in parallel to a first wall in the processing chamber 1. A first power supply (PS-M) 4 supplies power for driving the matrix plasma source and is thus connected to the first cathode 3 and the anode 1'. A cathode (CI) 5 of a plasma decomposition source is arranged at and in parallel to a second wall of the process chamber 1 and is connected to one terminal of a second power supply (PS-I) 6 that can be externally or internally mounted and supplies power to an formed plasma source, also called an igniting plasma generator, this generator being a plasma generator with closed electron drift.

Closed electron drift plasma generators/accelerators generally are axial-symmetrical devices in which the electrons have their electrical drift around the symmetry axis in closed loops. Plasma sources having short and extended acceleration zones are related to these devices, see e.g. the published International patent application WO 96/006518, V. V. Zhurin et al., "Physics of closed drift thrusters", 1999, Plasma Sources Sci. Technol., Vol. 8, R1-R20, and D. L. Tang et al., "Linear ion source with magnetron hollow cathode discharge", Rev. Sci. Instrum. Vol. 76, 113502, 2005, 4 pages. In these devices only electrons are magnetized. In the source according to the published International patent application WO 89/11207 electrons and ions are magnetized. In the sources having magnetron like magnetic fields the electrons are magnetized, see e.g. the book "Industrial Plasma Engineering", J. Reece Roth IOP Publishing Ltd., 1995, Vol. 1.

A gas supply (GS) system 7 provides the required gases such as acetylene, oxygen, nitrogen and argon through inlets 7' to the process chamber. The concentrations of the various components of the gas mixture may be varied or controlled using gas flow meters, not shown, controlled by a computer, not shown. A work piece motion device 8 is connected to the work piece (WP) 11 and is arranged to move the work piece in two or three dimensions. An electrical insulator 9 is coupled between the work piece and work piece motion system. A third power supply (PS-P) 10 for precipitation of ions and ionized radicals onto the work piece 11 is connected both to the work piece and the anode to give the work piece a negative potential in relation to the anode. An outlet 12 of the process chamber 1 is coupled to a vacuum system, such as a suitable pump, not shown.

The composite material as described herein can be deposited as follows:

1. Carbon Based Matrix Plus Carbon Based Pillars

A material consisting of a carbon based matrix plus carbon based pillars is deposited by using the plasma decomposition source for cracking, in the gas mixture containing a carbon containing gas, nitrogen and oxygen, the carbon containing gas to form radicals. A variation of the ratio pillars/matrix can be achieved by varying the nitrogen concentration, see FIGS. 1a-1c, and the description thereof below. It was found that the higher is the nitrogen concentration the higher is the concentration of pillars. The decomposition plasma source, also called cracking plasma source, is suitably operated in a pulsed regime since it is necessary to crack a high percentage of the molecules located in the plasma that can be said to have the shape of a column extending from the cathode.

The cracking, also called decomposition, of the gas molecules is accomplished by collisions with free electrons in the plasma. A high intensity or high rate of the decomposition requires a high density of electrons or, what is the same, a high plasma density. A high plasma density can be achieved by a high space discharge driving current density, as is also discussed below.

The power supply 4 for precipitation of the plasma onto the work piece 11, i.e. for the matrix plasma source, can be operated in a DC regime or a pulsed regime because the electrical conductivity between the electrodes thereof, the cathode CM and the anode walls 1', is achieved by the plasma decomposition source. Therefore the plasmas formed by the pulses of the plasma decomposition source are driven by the matrix plasma source towards the work piece. It was found that the current density at the work piece surface in many cases suitably may be in the range of $0.01$-$1.0$ $A/cm^2$.

The layer formed by the precipitation can be grown as a single layer having a substantially uniform composition, i.e. as a monolayer. The thickness of such a monolayer consisting of pillars and a carbon based matrix may be in the range of e.g. from 100 nm up to a few mm, for example 2 mm, and for achieving a layer having a good damping it can be in the range of say from some hundreds of gm, say from 200 µm, up to 2 mm.

In another case, the layer growth can be interrupted. It is achieved by removing the carbon containing gas and nitrogen from the gas mixture in which the plasma is formed, i.e. not supplying any carbon containing gas to enter the process chamber 1 from the gas supply 7. In that case specifically only oxygen is supplied to flow through the process chamber. It results in oxidation of the surface of the already formed layer. It was found that after the gas mixture is balanced again a new layer of pillars and matrix will grow independently of the pillars and the matrix in the already formed layer, or of the upper layer in the case where a plurality of layers has already been formed. Hence, this procedure allows growing of a multilayer structure, see FIG. 5a to be described below. The multilayered structure increases the damping capacity of the material which is thought to be caused by internal friction between the layers. The integration/friction between layers is adjustable, see the description with reference to FIGS. 5a, 5b below. Basically, it is achieved by varying the amount of oxidation, i.e. the time period during which the oxidation is performed.

In still another case, the interruption of the growing of pillars perpendicularly to the surface of the work piece 11 can be achieved by varying the concentration of nitrogen in the gas mixture. A higher concentration of nitrogen increases the number of pillars in the layer formed. It results in an enhanced damping capacity of the material formed.

2. Metal Matrix Plus Carbon Pillars

Figure 6A:
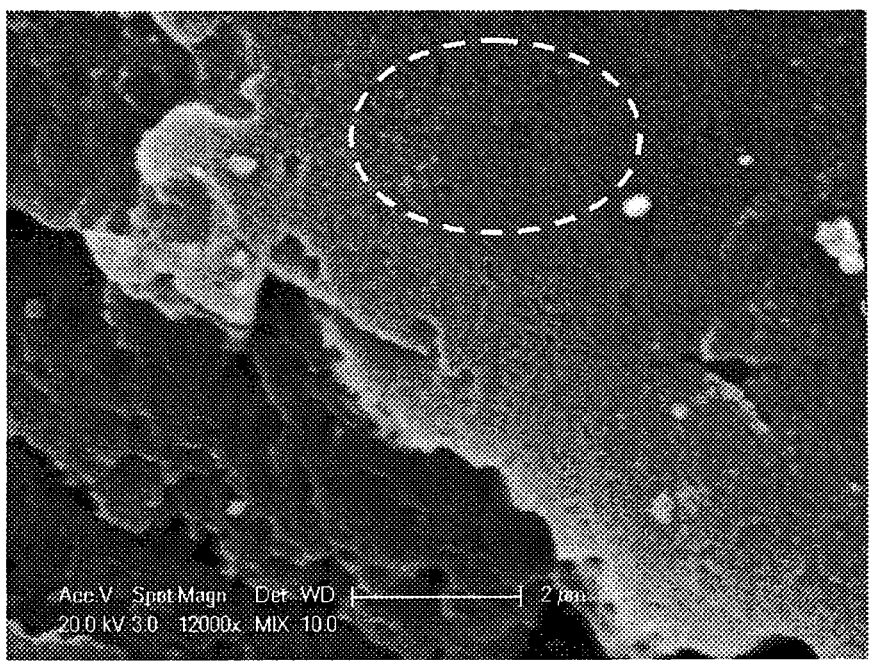
FIG. 6a is an ESEM image of the domain growth at the bottom of a layer.
Figure 6B:
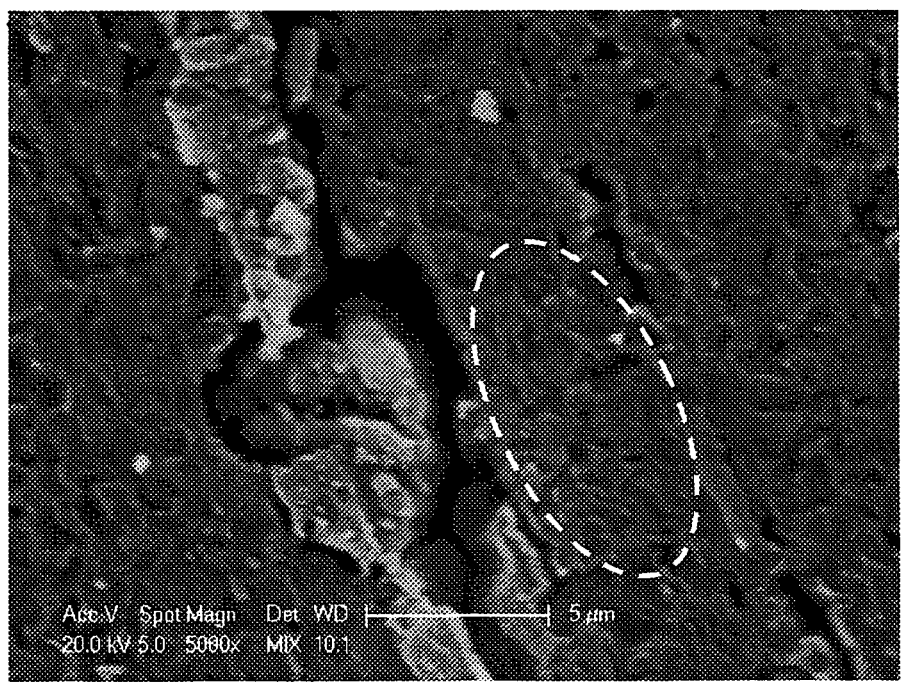
FIG. 6b is similar to FIG. 6a for another sample.

In this method the same basic, repeated step of growing layers of carbon pillars and a carbon matrix is used. The growing starts as above by forming at the surface of the work piece 11 independent, separated or distinct domains or islands that are the nuclei for the further growing of a thick layer as has been observed in microphotographs. It was found that when the thickness or height of the islands has grown to about one hundred or a few hundreds of nm the islands are so numerous that they then join together and form an almost continuous layer as is shown in FIGS. 6a and 6b. Hence, if the film thickness is less than one or a few hundreds of nm, say e.g. three hundred nm in a typical case, the domains or islands are independent and separated from each other at the surface of the work piece. If it is the case the islands can be embedded for example by a metal matrix that is deposited by sputtering from the cathode CM 3 of the matrix plasma generator. The layer growing process is in this case is as follows. First the islands are formed, thereafter a matrix material is deposited on top of the islands and between, then again islands are formed, the matrix material is deposited over the islands and between, and so on. The plasma decomposition source 5 and the matrix plasma source 3 are activated one after another. The period of operation of each of them in this repeated fashion is selected so that it is sufficient for achieving the desired or required layer structure in each step.

Generally, in the basic step, when the second power supply 6 is operated to create a discharge between the anode and the second cathode 5 and the process chamber 1 contains suitable desired concentrations of the reactive gases acetylene, oxygen and nitrogen, a plasma is formed and a layer is deposited on the inner walls 1' of the process chamber 1 and also on the surfaces of the work piece 11, the deposition on the work piece being enhanced by the negative biasing thereof provided by the power supply 10.

Figure 1A:
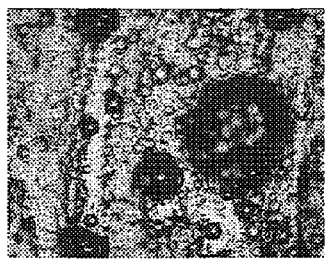
FIGS. 1a, 1b and 1c are microphotographs of the topography of deposited layers for different gas mixtures.
Figure 1B:
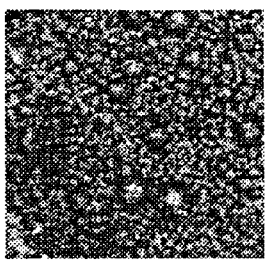
Figure 1C:

FIGS. 1a-1c are microphotographs of the surface structure of such layers obtained in the basic step for a magnification of 122 times The layers have a thickness of 0.5 mm (500 µm) and were deposited on samples of tool steel. The layers were synthesized using different compositions of the gas mixture in the process chamber 1. The microphotograph of FIG. 1a is taken of a layer produced using a gas mixture of 60% nitrogen, 30% acetylene and 10% oxygen, FIG. 1b for a gas mixture of 40% nitrogen, 50% acetylene and 10% oxygen, and FIG. 1c for a gas mixture of 10% nitrogen, 80% acetylene and 10% oxygen. The power of the electric discharges that were used for producing the layers was the same for the layers in all three pictures. As can be observed, the structure of the surface strongly depends on the nitrogen content. The material of the layers is arranged as carbon based pillars that are embedded in a carbon based matrix material. The pictures of FIGS. 1a, 1b and 1c show that the surface density of the pillars is strongly dependent on the nitrogen content in the gas mixture. The higher concentration of nitrogen the higher is the density of the pillars (number of pillars per area unit). It was found that it is in this way possible to vary the volume ratio of the pillars in relation to the carbon based matrix from 3% to 97%.

Figure 2:
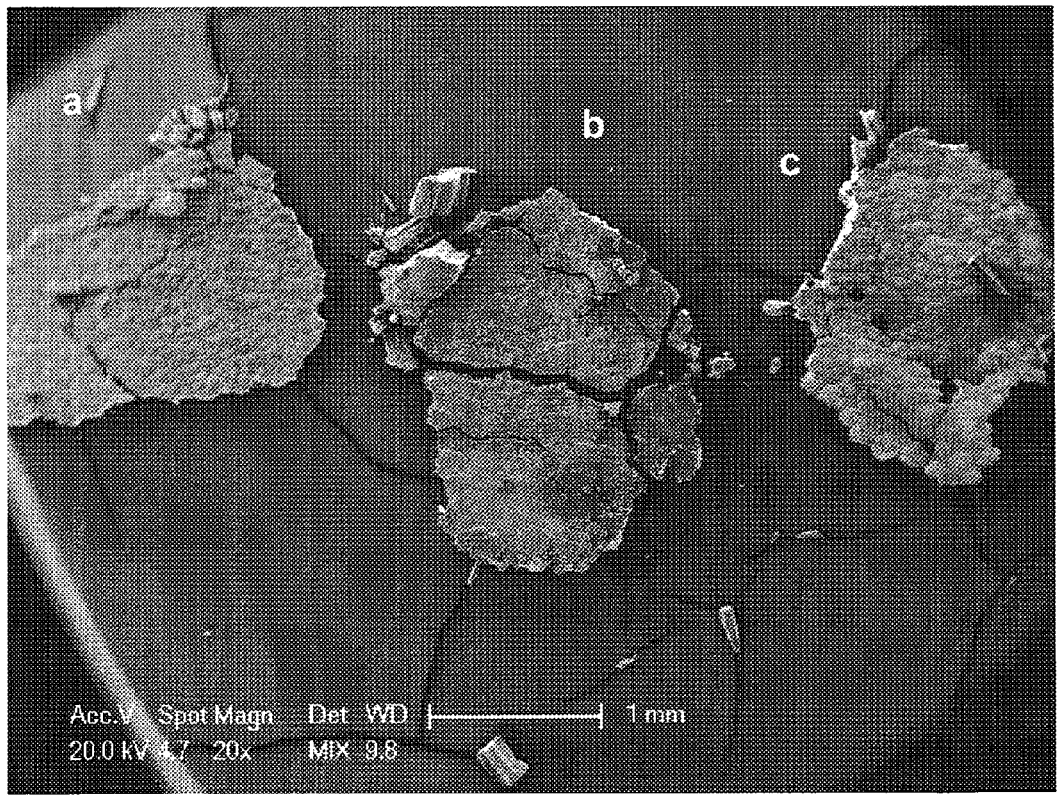
FIG. 2 is an ESEM photograph of pieces of a deposited layers for a gas mixture composition of 40% nitrogen, 50% acetylene and 10% oxygen.

The photograph of FIG. 2, captured using an Environmental Scanning Electron Microscope (ESEM), show three samples a, b and c of the material of such a layer produced using the same gas mixture as for producing the material seen in the photograph of FIG. 1b. The samples are pieces taken from layers synthesized using a high intensity plasma at a steel work piece, are fixed to a carbon substrate and have a thickness of about 500 μm. Sample a is placed with its top surface facing the camera and sample b is placed with its bottom surface facing the camera, samples a and b taken from the same layer. Sample c is placed with its top surface facing the camera and is taken from a layer synthesized using a plasma having lover intensity than that used for producing the layer from which samples a and b are taken. As can be observed the structure of the top and bottom images are completely different, and the diameter of the pillars decreases when increasing the power of the electric discharge used for synthesis of the material.

Figure 3A:
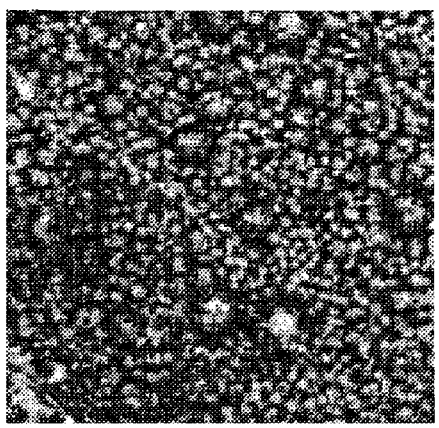
FIG. 3a is a microphotograph identical to FIG. 1b, FIGS. 3b-3d are ESEM photographs for the same sample as in FIG. 3a for different magnifications.
Figure 3B:
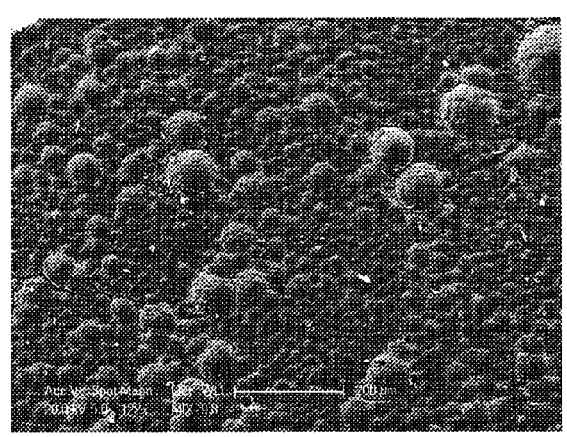
Figure 3C:
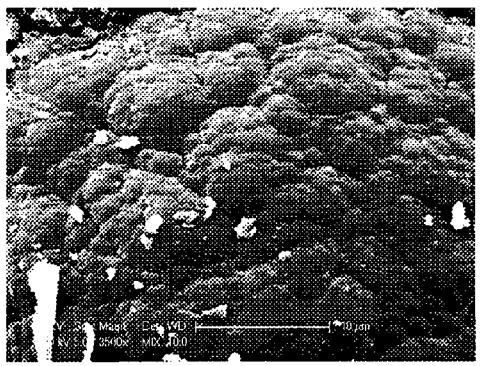
Figure 3D:
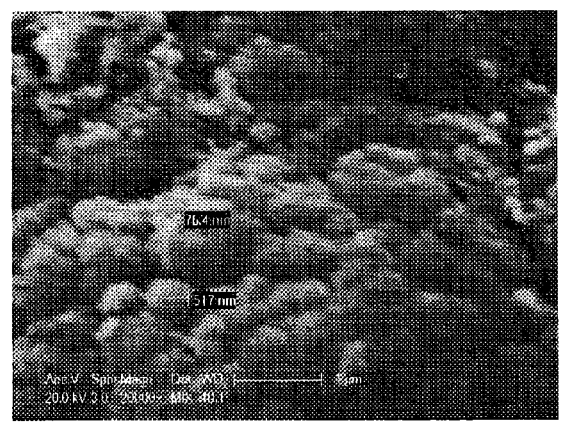

The photograph of FIG. 3a is taken of the sample b in FIG. 2 and FIGS. 3b, 3c and 3d are photographs, captured from above using an ESEM of the same sample for different magnifications. It was found, in a scanning electron microscope (SEM) investigation of the material samples, that both the pillars and matrix have an internal structure and are aggregates of small domains having characteristic dimensions of ranging from 10 nm up to about 100 nm. The matrix is the material that fills the voids between pillars, as can e.g. be better observed in FIGS. 4b and 4c.

Figure 4A:
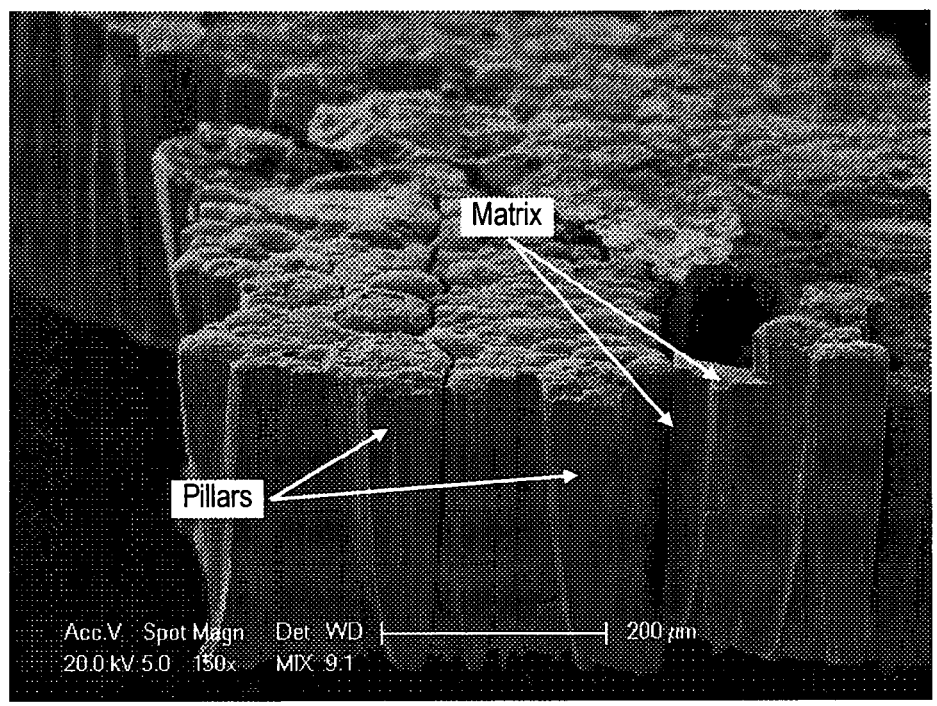
FIGS. 4a-4d are ESEM photographs of the same sample but taken from the side.
Figure 4B:
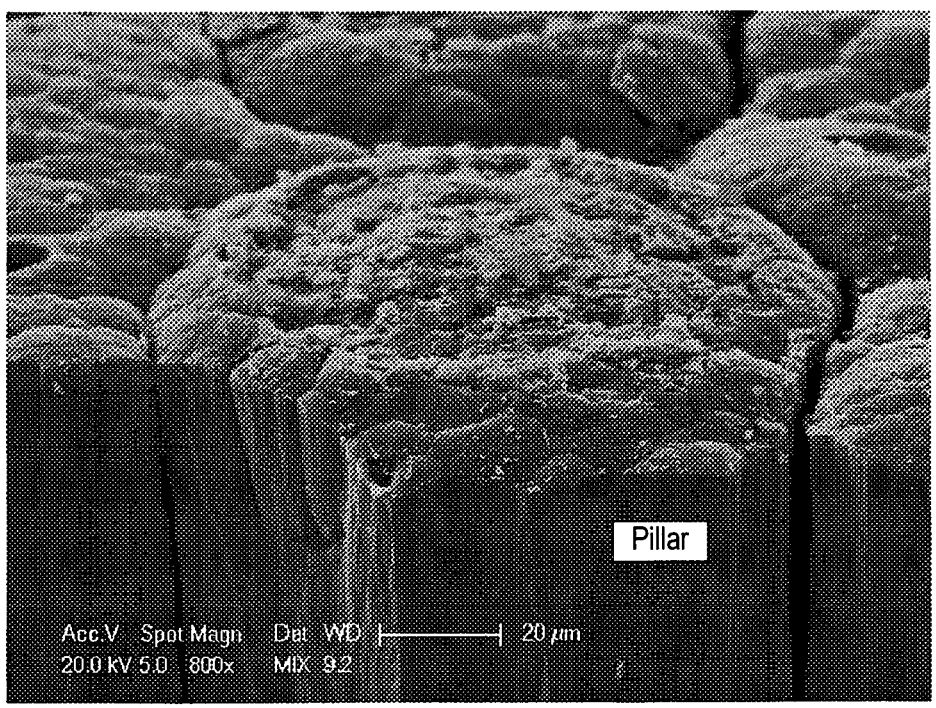
Figure 4C:
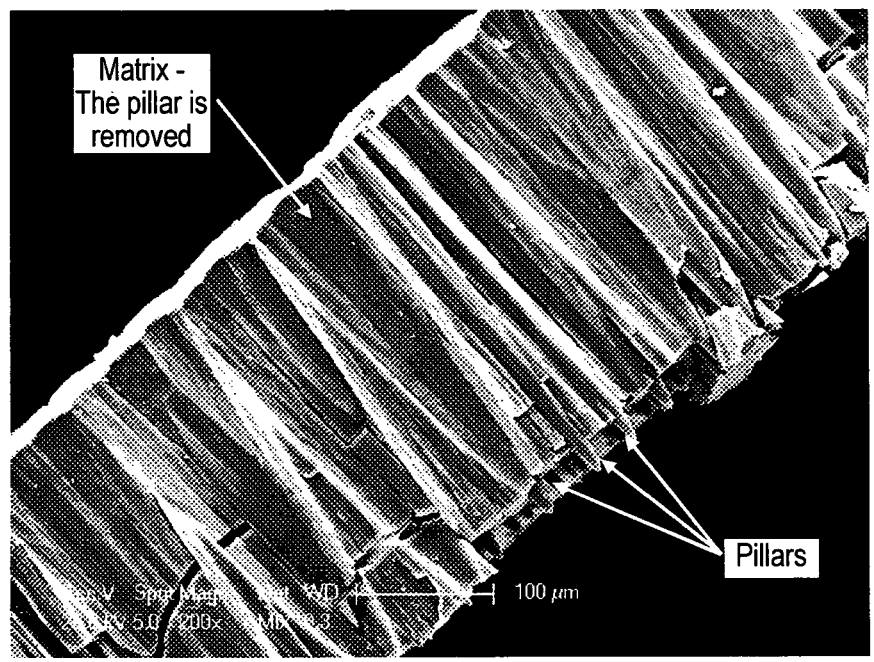
Figure 4D:

FIGS. 4a-4d are ESEM photographs, captured from the side, of the material in the same sample. The complex structure of the material consisting of pillars and the carbon based matrix is best seen in FIGS. 4a-4c. An increase of the magnification allows observing the internal structure of the pillars that are arranged by smaller objects that in its turn consists of smaller objects and so on up to objects of about 10 nm. The investigation of the pillars structure has shown that the pillars, see FIGS. 5a and 5b, has a pentagonal or hexagonal cross-section up to dimensions of 10 nm. The pillars are embedded in the carbon based matrix. It was found that the carbon based matrix is arranged as a planar layered structure, see FIG. 4d. The proportion between pillars and carbon based matrix can be varied by varying the gas mixture composition, as discussed with reference to FIGS. 1a-1c. The dimensions of the cross-section of the pillars can be varied by varying the power of electric discharge used in producing the layer. The dimensions of the cross-section of the pillars also depend on the layer thickness. It was found that for a layer having a thickness of 1.5 mm (1500 μm) the largest pillar dimension is also about 1.5 mm. The height of the pillars may be substantially as large as the thickness of the deposited layer. The ratio of the height to cross-section dimensions can vary from 1 up to at least 10. It was observed that well shaped pillars appear already at heights of about 10-100 nm.

According to carbon allotropy the layered structure of the carbon based matrix can be interpreted as a graphine structure. According to definition the graphine carbon modification is a stressed polycyclic carbon spider silk (characterized by $sp^2$-bonds) having a high degree of condensation. Such a carbon modification, i.e. graphine, constitutes the planar multilayered structures of the matrix. It is possible to synthesize graphine structures if one third of the carbon-carbon bounds in the hexagonal carbon rings are replaced by sp-hybridized acetylene (—CC—) radicals. In the method as described herein acetylene is the chosen gas that supplies carbon for producing the carbon based layer and it is decomposed in radicals by the electric discharge used in producing the pillar layers.

However, the pentagonal and hexagonal shapes of the pillars and the planar-like structure of the carbon based matrix clearly point to $sp^3$- and $sp^2$-hybridizations. It means that the pillars and the matrix are arranged by such carbon based objects/clusters as diamante-graphite hybrids. The characteristic clusters dimensions are of the order of magnitude of 10-100 nm, see FIGS. 3a-3d. The clusters are aggregated into macro objects. The growth of the pillars or the matrix is caused by the surface structure of the substrate on which the deposition is made.

Therefore, the material in the carbon pillars/carbon matrix layers can be described as follows. The carbon matrix/carbon pillars can form either a monolayer or multilayer material
- As to its chemical composition it is hydrogenated carbon or hydrogenated carbon nitride with presence of some oxygen.
- As to its structure it is built from hybrids related to graphine-diamond area of carbon allotropy.
- As to its dimensions both the carbon pillars and the carbon matrix are formed by nano-clusters aggregated into macro objects.

The material in the carbon pillars or clusters/metal or silicon matrix layers can be described as follows.
- As to its chemical composition it is hydrogenated carbon or hydrogenated carbon nitride located in the metal or silicon.
- As to its structure it is built from hybrids related to graphine-diamond area of carbon allotropy randomly distributed in a metal or silicon bulk or matrix.
- As to its dimensions the carbon clusters are nano-clusters randomly distributed in the macro dimensional layer of metal or silicon. The clusters include two portions, the nano-pillars and a nano matrix material, the pillars embedded in the nano matrix.

EXAMPLE 1

The sample comprising a monolayer of pillars as seen in the photograph of FIG. 1b was producing the following process.

In apparatus such as that seen in FIG. 8 in which the process chamber 1 had a volume of 30 liters and the chamber walls were water cooled a basic pressure was maintained at $10^{-6}$ Torr using a turbo-pump pumping at a pumping speed of 100 l/s. The gas mixture was allowed to enter and pass the chamber at an operating pressure of $2 \cdot 10^{-2}$ Torr. The gas composition for deposition of carbon clusters was 40% $N_2$, 50% $C_2H_2$ and 10% $O_2$.

The decomposition plasma source had a planar carbon cathode that had a diameter of 50 mm, was enhanced by a magnetron-like magnetic field and was not cooled. It was operated using interrupted DC discharges, the discharges having a discharge current of 3.0 A, a duty cycle of 0.5 and a work piece current of 50 mA, generated by the PS-P 10. The minimum distance between the work piece 11 and the decomposition cathode was 80 mm. The deposition rate was 20 μm/h, the pillars/matrix ratio was 40-60%, the layer thickness was 500 μm, and the aspect ratio, i.e. the height/width ratio, of the pillars in the layer formed was 4-8. The work piece rotation speed was about 1 rpm and the work piece reciprocal motion amplitude was +/−100 mm relatively to a motion centre.

The static stiffness of the material was measured to have a value of 15 GPa using a dynamic measurement method. The damping factor of the layer produced was measured to have a value of 60 when deposited on a steel bar having diameter of 50 mm and a length of 200 mm.

Figure 5A:
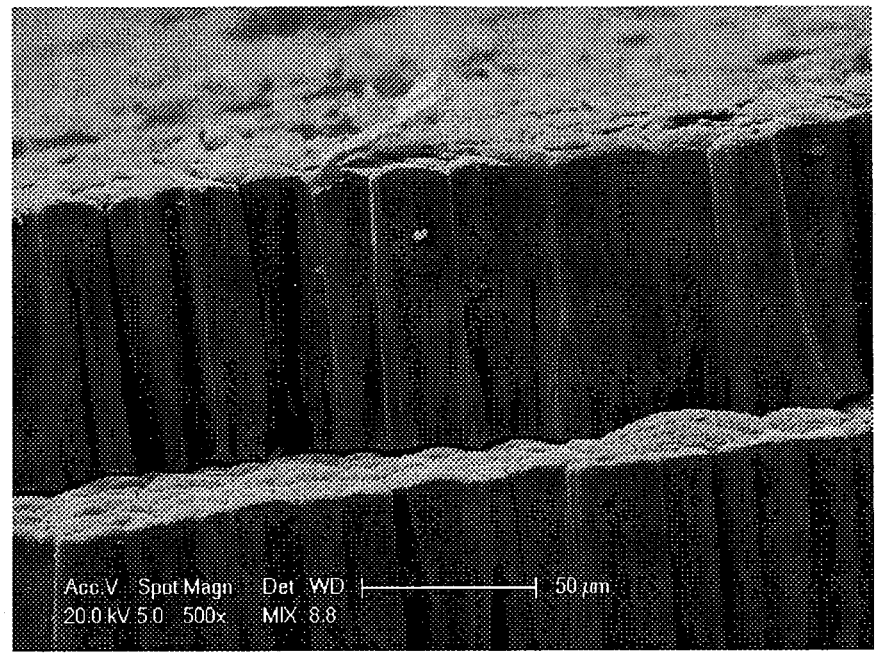
FIG. 5a is an ESEM photograph of a composite, layered material structure taken from the side.
Figure 5B:
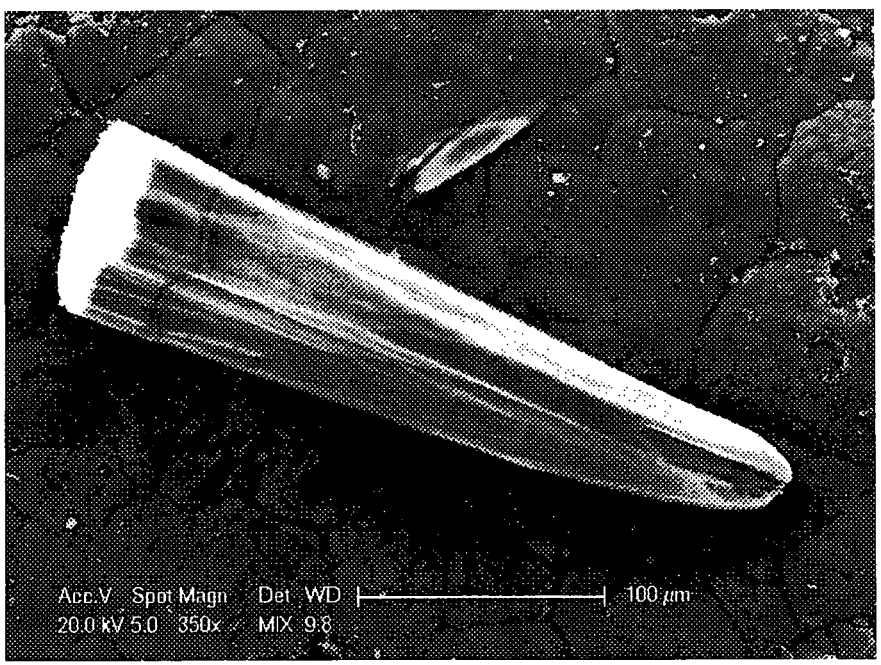
FIG. 5b is an ESEM photograph of a single aggregate grown in two periods with an interruption.

FIG. 5a is an ESEM photograph taken from the side of a multilayered structure. Between layers produced as described above other layers exist such as thin oxidized layers or metal layers. As described above, such intermediate layers can be produced by stopping the second power supply 6 and instead starting the first power supply, changing the gas composition to e.g. argon if a metal layer is to be produced. A new top layer containing the pillar structure will, after producing such an intermediate layer, grow basically independently of the layer of the same type existing beneath the intermediate layer. It was generally found that the rate of the integrity between adjacent pillar layers depends on the interface between layers, such as an intermediate layer. E.g., if the process of synthesizing a pillar containing layer has been interrupted for 10 hours but the material was not taken into atmosphere and the upper surface of the pillar layer was cleaned by plasma etching before continuing the synthesis the new layer will be strongly integrated with the already existing layer and the now formed upper structure continues the structure of the existing layer as seen in the ESEM photograph of FIG. 5b. In FIG. 5b the dark zone crossing the pillar corresponds to a period of process interruption. This allows forming multilayered structures or superlattices having a minimum thickness of the layers of about a few nm. The maximum layer thickness in a multilayered structure is above in the range of mm.

In the ESEM photographs of FIGS. 6a-6b the bottom side of the material in a pillar layer is shown. The piece of material was removed from the work piece surface. Regions where the characteristic topography of the material can be seen are surrounded by dashed lines. It was found that the dynamic of the initial phases of the material growth is such that the material starts to grow at the work piece surface in islands or domains. The diameters of the domains are about the layer thickness. Because of the high density of the pillars it may be said that they are the main objects at the surface. The work piece temperature for domain growth is about 100° C. The high mobility of the particles at the surface is caused by the particles having a high energy arriving at the surface. It was found that mainly ions and ionized radicals are participating in the process of material synthesis of the pillar layers. The characteristic energy of the particles is 1-3 eV which in terms of temperature is equivalent to 10 000-30 000° C. When the layer thickness increases the domains join to each other forming a continuous or contiguous layer. The structure of the layer formed also depends on the power of the electric discharge. The photograph of FIG. 6a is taken of a layer produced using a power that is higher than that used for producing the layer seen in FIG. 6b.

EXAMPLE 2

For producing a multilayer material a monolayer was first produced using the same apparatus and parameters as in Example 1. A pillar layer having a thickness of 50 nm was deposited and the aspect ratio, i.e. the height/width ratio, of the pillars in the layer formed was 4-8.

The deposition was stopped and instead the matrix deposition source 4 was started. It had a planar cathode 3 of copper that had a diameter of 80 mm, was of the type used in magnetron sputtering and was water cooled. The distance between the work piece 11 and the copper cathode was 80 mm. The supply of the gas mixture was stopped and instead argon was supplied at an operating pressure of $5 \cdot 10^{-3}$ Torr. The matrix deposition source was run in a DC operating regime with a discharge current of 0.5 A.

The igniting plasma source and the matrix deposition were activated alternatingly for time periods having approximately the same length to produce a composite layer having a total thickness of about 50 μm, each composite sublayer including a pillar layer and the matrix having a thickness of about 300 nm.

The static stiffness of the material was measured to have a value of 15 GPa using a dynamic measurement method. The damping factor of the layer produced was measured to have a value of about 40 when deposited on a steel bar having diameter of 50 mm and a length of 200 mm.

The chemical composition of the material in the pillar layer has been investigated. It was found that by synthesis of the material from the gas mixture that relates to FIG. 1b and sample a in FIG. 2 the composition consists of all chemical elements that were introduced into the process chamber 1. The concentrations of the involved elements are listed in Table 2. For the chemical analysis EDX and ESCA (XPS) instruments were used. It was found that the chemical composition of the pillars and the carbon based matrix is the same.

TABLE 2

| Chemical Element | at % |
| --- | --- |
| Pillars | |
| Carbon (C) | 74-84 |
| Oxygen (O) | 9-14 |
| Nitrogen (N) | 8-12 |
| Hydrogen (H) | 10-20 |
| Matrix | |
| Carbon (C) | 74-84 |
| Oxygen (O) | 9-14 |
| Nitrogen (N) | 8-12 |
| Hydrogen (H) | 10-20 |

As described above, also a multilayered/superlattice composite material can be produced. The chemical composition of materials of this kind is shown in Table 3. Wider limits of the chemical elements constituting the pillars are listed because they correspond to the gas mixtures used for producing the samples seen in FIGS. 1a-1c. The matrix material in this case can be chosen independently.

TABLE 3

| Chemical Element | at % |
| --- | --- |
| Pillars | |
| Carbon (C) | 4-90 |
| Oxygen (O) | 1-204 |
| Nitrogen (N) | 0-30 |
| Hydrogen (H) | 3-40 |
| Matrix | |
| Metal | |
| Metal allow | 1-99 |
| Silicon | |

Figure 7:
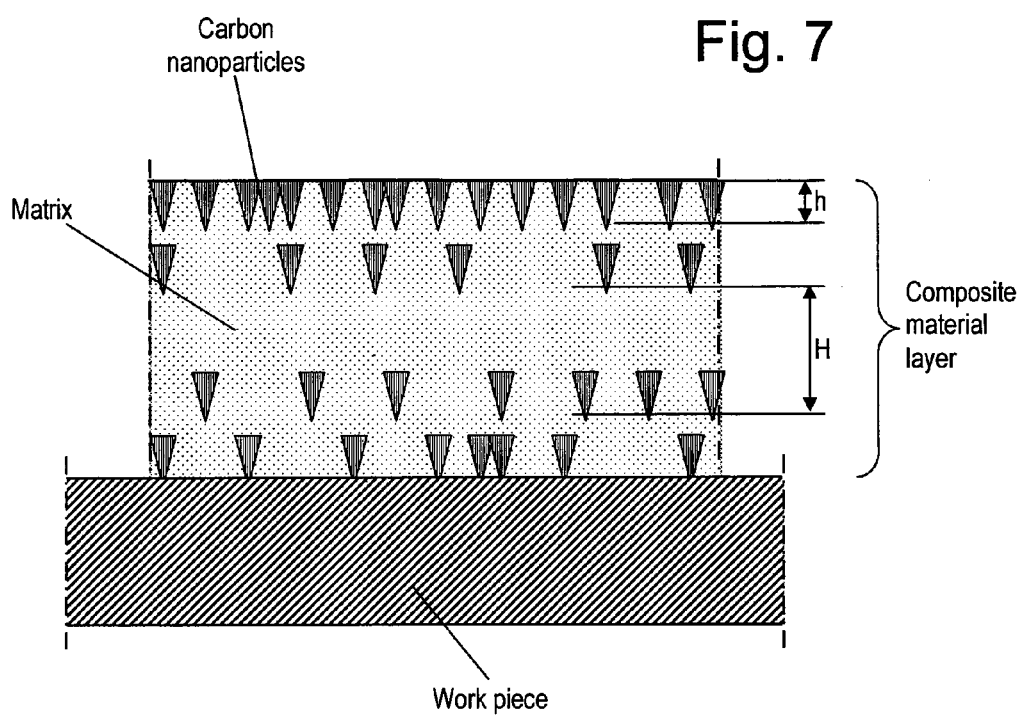
FIG. 7 is a schematic of a composite carbon particle reinforced material.

The structure of the composite material including a metal arranged in a multilayer structure is schematically shown in FIG. 7. The process of producing the composite material includes the following steps as has been discussed above. Initially the domains of the pillars are deposited on the work piece surface. The pillars are covered by a layer of the special matrix material. The matrix is any metal, alloy or silicon. On top of the matrix layer another layer of domains is deposited, these domains being independent of those in the bottom layer. This process can be continued to produce as many layers as desired and thus generally allows synthesis of e.g. a metal or similar material reinforced with carbon nanoparticles. The nanoparticles are of fullerene type, nanotubes or diamond-graphite hybrids. The nanoparticles can generally be expected to have structures in the grapheme-diamond area that are characterized by spn hybridization, where $2<n<3$. This is based on the hexagonal and pentagonal cross section of the pillars and the planar-like structure of the matrix.

The height h of each domain layer or pillar layer may be in the range of about 1-10 nm. The total height H of each sublayer including a domain layer and a superposed matrix layer is variable in the range of 10 nm-500 μm. The method allows synthesis of sublayers having a thickness accuracy of 0.1 nm. The volume proportion between pillars and the special matrix material can be varied within a wide range. By adjusting the parameters materials can be provided that have from an extremely high static stiffness and a moderate damping to a high damping and a moderate static stiffness. A metal matrix can e.g. be W or Mo. The reinforcing material is the carbon nanoparticles that in the composite material exist in a concentration of typically 3-10 wt %. As has been shown earlier for polymers, cement and metal the tribological properties of the carbon nanoparticles are not less good than those of the matrix material and can increase the material stiffness up to 2-3 times, see the cited articles by X. Zhou et al. and Mark D. Frogley et al. A low percentage of the matrix material gives a composite material that has extremely good damping properties The tribological and damping properties of the macro pillars—graphine composite material have been investigated. It was found that the hardness measured by a micro indenter is about the hardness of copper that is 0.5 GPa. The hardness measured by sliding of the stainless steel ball (20 GPa) along the material surface showed that the ball was eroded by the material It means that the hardness of the composite material is more than 20 GPa. Such a large disagreement of the hardness value one can explain as follows. The sharp pyramidal indenter to be pressed into material layer cleaves it along the boundary between pillars or layers of the matrix. It is known fact that matrix layers are bonded by week Van der Waals forces and can be easily laminated from each other. If the stainless steel ball is sliding along the composite surface the hard pillars/matrix operate as the abrasive material. The conclusion is that micro indenter method of the hardness measurements is not applicable to these kinds of composite materials. The material has a complex three-dimensional structure and cannot be characterized by scalar hardness.

The stiffness of the macro-pillars-graphine composite was measured using a dynamic method that means that Young's modulus of the material was calculated according to a well-known equation when the natural frequency is measured, see: Z. S. Li and al., "Evaluation of the internal friction and elastic modulus of the superhard films", Material Science and Engineering A370 (2004), pp. 186-190. It was found that the E-module is 154 GPa. This is 50% higher than Copper E-modulus and 20% higher than that of cast iron.

The damping properties of the macro pillars composite material have been investigated using of dynamic tests. They include:
Experimental Modal analysis—elastic suspended
Experimental Modal Analysis—SPÄNNO—overhung: 140 mm Machining tests were performed using a turning machine SMT 500. In particular an internal turning operation was investigated using a work piece of steel SS 2542. The bar overhung was 140 mm, a standard cooling fluid was used, the feed per turn was 0.3 mm and the depth of cut was 3 mm. The clamping system used for work piece was Hydrofix D having a diameter of 32 mm and a collet having a diameter of 32 mm.

The boring bar used in the turning operation was partly coated with a macro pillar-graphine damping layer consisting of two sub-layers as shown in FIG. 5a. The total layer thickness was 500 μm (0.5 mm). As described above, this resulting in a significant (one decade) reduction of the vibration amplitude at a rotation speed of the work piece that was near its natural frequency. The chatter of the cutting tool was almost completely suppressed. The roughness height of the work piece surface was 0.1 μm. For comparison it can be said that in a turning operation using the same boring bar having no damping layer, the intensive chatter produced gave a roughness of the work pieces surface that was more than 200 μm.

In general it can be said that the damping properties of the material as described above are comparable to the properties of viscoelastic polymers that are known to be superior, see the above cited paper by Ball and Salyer. The superior damping properties of the composite material may be conceived as caused by friction between the nano-sized particles constituting the pillars and the friction between nano-sized layers constituting the graphine matrix. Both the pillars and the layers are elastically connected to each other, this allowing a relative motion. Also, it allows a reduction of the stresses in the produced layers that gives the possibility of depositing thick layers of the material without cracking and delaminating from the work pieces. The production method allows synthesis of material layers having a total thickness of the millimeter range.

The low pressure PECVD process as briefly described above, used for producing the pillar layers, is based on the decomposition (cracking) of carbon containing gases by collision of the gas molecules with electrons. The composite material synthesis at the work piece surface is performed by precipitation of ions and radicals at the work piece surface by the voltage applied between the work piece and the walls of the processing chamber that are the anode. The specific of this method is the dependence of the composite material conductivity on the voltage applied. It was found that for a low voltage of 10-100 V the material has dielectric properties because of presence of hydrogen and oxygen in the material. For a voltage of 1-2 kV the material becomes a conductor having a relatively low electrical conductivity. It was found that the transition of the deposited material from a dielectric to an electrically conductive state can be achieved if the power of the discharge of the igniting plasma generator exceeds a minimum limit. In other words, it means that in order to obtain the desired electrical current between the work piece and the processing chamber walls and thereby achieving material synthesis at the work piece, the power of the igniting discharge must be larger than some limit value.

If the material to be produced is only the macropillar-graphine composite it is enough to only provide the igniting plasma generator and the anode work piece precipitation cell, i.e. the device for biasing the work piece 11 using the power supply 10. The machine design can be in-line or batch type.

For synthesis of a composite material having a non-graphine matrix an additional plasma source, including the anode 1', the cathode 3 and the power supply 4, is required. A PVD method is used to produce the metal or alloy or silicon matrix. The PVD method can be of any type. The main requirement is a sufficient precipitation rate that has to be in the range of 10-100 μm/h. Possible methods include plasma spraying, electric arc and sputtering. The process of the material synthesis is as follows.

The periods of electrical discharges produced in the igniting plasma source and the periods of activating the discharges for material synthesis at the work piece surface are synchronized and may have e.g. the same time duration and duty cycle. The process of alternative matrix deposition is performed in intervals between the composite material syntheses. It was found that the optimal igniting and synthesizing discharges time is from 1 ms to 10 s. The duty cycle is 0.1-0.5. In general, the acceptable discharge time and duty cycle can be in the range of 10 μs-10 s and the duty cycle can generally be in the range of 0.01-0.5. The minimum cathode surface power density of the igniting discharge is 10 W/cm$^2$. The work piece surface power density of the synthesizing discharge is in the range 10 mW/cm$^2$-1 W/cm$^2$. If the work piece surface density is higher than 1 W/cm$^2$ the discharge operates as a work piece cleaning/sputtering discharge. It allows running both cleaning and synthesizing discharges using the same hardware.

Technical fields in which the material described above can be used include:

- Axial-flow compressors, turbines and fans, as in aircraft engines and like turbomachines including a stator disc and a rotor disc.
- Various machines and machines parts which perform material removal processes such as turning, boring, drilling, grinding, reaming, threading, milling, shaping, planning and broaching.
- Various tools which perform material removal processes such as turning, boring, drilling, grinding, reaming, threading, milling, shaping, planning and broaching.
- All kinds of cutting inserts.
- Micromachines and microtools that are sets of hardware used to fabricate features, components or systems having dimensions most conveniently described in μm.
- Miniaturization technologies that are techniques and processes used to engineer small systems and components.
- Precision processes, machines, tools, and accessories.
- Precision measurement instruments.
- Gears, microgears.
- Bearings.

Some more examples of the use of the material for enhancing the dynamic stiffness will now be discusses.

1. Internal Grinding Technology, Internal Grinding Tools.

Problems that modern internal grinding technology faces include internal grinding tool bending and disruptive vibration of grinding quill if the rotation speed approaches the natural frequency of any of the parts participating in the grinding operation, in particular that of the quill. These phenomena limit the upper value of the force that acts on the grinding quill and the maximum quill rotating speed. A standard value is a deflection of 10 μm for a force of 10 N acting on the grinding quill. The standard maximum for the speed is 80% of the natural frequency of the spindle or quill. Modern technology requires a further increase of the force without any significant bending and without any strong increase of the quill vibration amplitude. The characteristic rotation speed is 200 kRPM. It requires development of internal grinding quills having a low weight and enhanced dynamic stiffness.

Low weight and high dynamic stiffness of the spindle-quill system is required to maintain the dimensional precision, the fine surface finish and the precise geometry of the work pieces. At present, advanced quills are manufactured from the tungsten carbide and having a mass density of about 16 g/cm$^3$. A high mass density results in a decrease of the natural frequency, it correspondingly limiting the quill rotation speed to a lower frequency. Therefore a light and stiff material for quill manufacturing is required. As well, the system spindle-quill has to have enhanced vibration damping in order to be capable of passing through the resonance into the high rotation speed region. In other terms, a high dynamic stiffness of the spindle-quill unit is required. As has been discussed above, the carbon nanoparticles reinforced composite material is a possible material for enhancing the dynamic stiffness of grinding tools and the spindles thereof. The design of internal grinding tools is illustrated in FIGS. 9a, 9b and 9d-9g. A grinding tool thus consists of a bar, i.e. an elongated body having a constant diameter, that at one end carries a grinding wheel and at the opposite end has a larger diameter portion disks for clamping the tool in the spindle of the grinding machine, not shown. The bar consists of a central body 103 that is covered by the composite material layer 101. The composite material on the portion of the bar which has the smaller constant diameter, has a superior static stiffness and a high damping. In the portion intended for clamping in the spindle the composite material has a superior damping. It was found that the thickness of the composite material layer has to be in the range of 0.5-1.0 mm, the static stiffness has to be in the range of 650-800 GPa and the damping capability as high as for viscoelastic polymers. The enhanced dynamic stiffness of the quill provided with such a layer allows eliminating the intensive vibration of the tool when the rotation speed approaches the resonance frequency. The computed amplitude of tool vibration is showed in the diagram of FIG. 9c. The material of the central body of the bar is tool steel. The graph drawn in black colour corresponds to an undamped tool. The other graphs are drawn for a damping layer having a thickness of 0.5, 1.0 and 1.5 mm, respectively. The horizontal black line is the critical limit for the vibration amplitude that, as accepted as a standard value in internal grinding industry, corresponds to a rotation frequency being 80% of the natural frequency. It can be observed that for damping layer thickness larger than 0.5 mm the vibration amplitude does not exceed the critical one. It means that the high dynamic stiffness eliminates the problem of the tool disruptive vibration at the resonance frequency and that tool can be accelerated up to a high rotation speed.

FIG. 12 is a schematic of a part of turbine stator with a turbine blade that is compressed against the stator by a spring via a layer of damping material. As the damping material for enhancing the turbine dynamic stiffness viscoelastic polymers can be used, see U.S. Pat. No. 6,102,664 and U.S. published patent application 2006/060696. The damping of the turbine vibration is advantageous for the turbine and associated parts and machines and also improves environmental conditions inside e.g. the cabin of aircraft and in other technical fields in which turbines are used. The drawbacks of using viscoelastic materials include as above the otherwise low mechanical properties of polymers, a low thermal limit of operation and the natural tendency of polymers to degrade, in a hazardous environment. The pillar-graphine nano composite material as well as metal matrix nanocomposite has obvious advantage in this area of technology.

In FIG. 13 a gear assembly is schematically shown. The side walls of the gears are covered with layers of a vibration damping material. The layer is showed by gray color. It was found that a layer having a thickness of 500 μm, by one decade, reduces the noise generated in any gear transmission. An additional damping effect is achieved by applying a layer of the composite material having a metal matrix. Such a material having a high hardness and an enhanced damping capability can be applied on the gear teeth, see the layer having a black colour. The damping of gear transmission vibration is the decisive factor in micro manufacturing machines. The required accuracy in this technical field is in the range of nanometers and any significant vibration of the micro machines parts and micro tools results in a low dimensional precision, surface finish and geometry of the work pieces.

FIGS. 12a and 12b are schematics of an interference fit type cutting tool. The dynamic stiffness of the tool is enhanced by applying of a composite material layer between the head and the shaft. A high dynamic stiffness in all kinds of the tools for material removal results in a high dimensional precision, fine surface finish and precise geometry of the work pieces. A further increase of the tool dynamic stiffness can be achieved by covering the whole tool body with a composite material of the kind described herein. The enhancing of the tool dynamic stiffness can also be achieved by using cutting inserts that have a composite material layer applied to the side that is opposite to the cutting surface that is usually coated with a thin layer of a super hard material/ceramic.

It should be understood herein and in the claims hereof that such terms as "top", "bottom", "upwardly", "downwordly" and the like have been used for illustration purposes only, in order to provide a clear and understandable description and claiming of the invention. Such terms are not in any way to be construed as limiting, because the devices of invention are omni-directional in use as can be understood by their various uses in different application fields.

While specific embodiments of the invention have been illustrated and described herein, it is realized that numerous other embodiments may be envisaged and that numerous additional advantages, modifications and changes will readily occur to those skilled in the art without departing from the spirit and scope of the invention. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention. Numerous other embodiments may be envisaged without departing from the spirit and scope of the invention.

The invention claimed is:

1. A method for composite material synthesis at the surface of a work piece, wherein it includes PECVD, PEPVD methods and plasma generation by electric discharges with closed electron drift, wherein the composite material comprising at least one layer of substantially parallel carbon pillars extending from the bottom surface of the at least one layer up to the top surface of the at least one layer, the carbon pillars in particular having a cross-sectional dimension in the range of 50-200 μm, and in particular heights in the range of 50 μm-2 mm.

2. The method according to claim 1, wherein the pillars are or are built from macro-sized aggregates having at least one dimension in the nano range, in particular in the range of 10-800 nm.

3. The method according to claim 1, wherein the material in the carbon pillars has $sp^n$ atomic bonds or has an $sp^n$ degree of hybridization, where $2<n<3$.

4. The method according to claim 1, wherein the carbon pillars have substantially hexagonal or pentagonal cross-sections.

5. The method according to claim 1, wherein the pillars have a relatively weak conical shape, their cross-section widening from their bottom ends to their top ends, in particular with a widening ratio in the range of 1:10 to 1:30.

6. The method according to claim 1, wherein the carbon pillars are embedded in or surrounded by a matrix material, in particular a matrix material being the same type as the material of the carbon pillars, in particular in a less ordered state.

7. The method according to claim 6, wherein the matrix material is a non-polymer material or inorganic material, in particular a material selected among a metal, a metal alloy or silicon.

8. The method according to claim 6, wherein the matrix material has an internal structure that consists of layers having thicknesses down to 10 nm.

9. The method according to claim 1, wherein it comprises a plurality of layers, each comprising substantially parallel carbon pillars.

10. The method according to claim 1, wherein the carbon pillars are built from the narrower rods, these narrower rods built from even narrower rods and so on down to narrow rods having cross-sections of diameters in the range of 10-20 nm.

11. The method according to claim 1, wherein the pillars have a chemical composition including at least carbon, oxygen and hydrogen.

12. The method according to claim 1, wherein the pillars have a chemical composition including nitrogen.

13. The method according to claim 12, wherein the pillars have the following chemical composition:

| | |
|---|---|
| Carbon (C) | 4-90 At % |
| Oxygen (O) | 1-20 At % |
| Nitrogen (N) | 0-30 At % |
| Hydrogen (H) | 3-40 At %. |

14. A method according to claim 1, further comprising providing a work piece comprising the composite material at the surface to enhance the dynamic stiffness of the work piece.

15. The method according to claim 14, wherein said composite material is applied as a layer on a portion of the surface of the work piece.

16. The method according to claim 15, wherein the portion of the surface of said work piece covered by the composite material is from 1 to 100% of the total work piece surface.

17. The method according to claim 14, further comprising another workpiece, wherein the work piece is joined to the another work piece in a movable or an immovable, fixed or rigid way.

18. The method according to claim 14, wherein the work piece is used in internal grinding methods and/or internal grinding tools.

19. The method according to claim 14, wherein the work piece is used in axial-flow compressors, turbines or fans.

20. The method according to claim 14, wherein the work piece is used in machines and machines parts which perform material removal processes.

21. The method according to claim 14, wherein the work piece is used as a tool which performs material removal processes.

22. The method according to claim 14, wherein the work piece is used as a cutting insert.

23. A method according to claim 1, wherein the plasma generation is achieved using an interrupted direct current discharge.

24. A method according to claim 23, wherein the process duty cycle is from 1% to 50%.

25. A method according to claim 1, wherein the deposition period of a single layer is from 1 ms to 10 s.

* * * * *